(12) United States Patent
Standaert et al.

(10) Patent No.: US 7,488,679 B2
(45) Date of Patent: Feb. 10, 2009

(54) INTERCONNECT STRUCTURE AND PROCESS OF MAKING THE SAME

(75) Inventors: Theodorus Eduardus Standaert, Pine Bush, NY (US); Pegeen M. Davis, Millbrook, NY (US); John Anthony Fitzsimmons, Poughkeepsie, NY (US); Stephen Edward Greco, LaGrangeville, NY (US); Tze-Man Ko, Hopewell Junction, NY (US); Naftali Eliahu Lustig, Croton on Hudson, NY (US); Lee Matthew Nicholson, Katonah, NY (US); Sujatha Sankaran, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 11/461,137

(22) Filed: Jul. 31, 2006

(65) Prior Publication Data

US 2008/0026568 A1    Jan. 31, 2008

(51) Int. Cl.
*H01L 21/4763* (2006.01)
*H01L 23/48* (2006.01)

(52) U.S. Cl. .............. 438/622; 438/627; 438/637; 257/750; 257/751

(58) Field of Classification Search ............ 438/622, 438/625, 626, 627, 637, 638, 643, 644, 653, 438/654, 687; 257/750, 751, 752, 753, 762, 257/773, 774
See application file for complete search history.

(56) References Cited

U.S. PATENT DOCUMENTS

| | | | |
|---|---|---|---|
| 2004/0251552 A1* | 12/2004 | Takewaki et al. | 257/758 |
| 2005/0245068 A1 | 11/2005 | Gambino et al. | |
| 2005/0263891 A1* | 12/2005 | Lee et al. | 257/751 |
| 2007/0049007 A1* | 3/2007 | Yang et al. | 438/625 |
| 2007/0202689 A1 | 8/2007 | Choi et al. | |

* cited by examiner

*Primary Examiner*—Kevin M Picardat
(74) *Attorney, Agent, or Firm*—Yuanmin Cai (57) ABSTRACT

A method of forming an interconnect structure in an interlayer dielectric (ILD) material, the method include the steps of creating one or more via openings in the ILD material; forming a first liner covering at least one of the one or more via openings; creating one or more trench openings on top of at least one of the one or more via openings covered by the first liner; and forming a second liner covering the trenching openings and at least part of the first liner. An interconnect structure formed by the method is also provided.

30 Claims, 11 Drawing Sheets

INTERCONNECT STRUCTURE AND PROCESS OF MAKING THE SAME

FIELD OF THE INVENTION

The current invention relates to the field of semiconductor device manufacturing. In particular, it relates to an interconnect structure having trenches and vias and processes of making the same.

BACKGROUND OF THE INVENTION

In the field of semiconductor device manufacturing, active semiconductor devices such as, for example, transistors are normally manufactured by well-known front end of line (FEOL) technologies. Following the formation of active devices, interconnects or interconnect structures (as the terms may be used interchangeably throughout this application) may be formed or created using well-known back end of line (BEOL) technologies. An interconnect may include for example trenches and/or vias, made of conductive and/or metal materials, and may be used to selectively connect a set of active devices to achieve a desired function or performance or a combination thereof. In addition, two or more layers of interconnect structures may be formed together, creating an interconnect block, referred to herein as an interconnect unit.

Conventionally, an interconnect structure or a layer of interconnect structure may be formed by first creating one or more via openings in a layer of ILD materials. The ILD layer may be formed or deposited, such as through a conventional CVD or MOCVD technique as well-known in the art, on a surface of a prior level of interconnect layer or interconnect structure. Subsequently, one or more trench openings may be created in the same ILD layer, in regions or areas where at least one or more of the via openings have been created. The trench openings may therefore overlap at least partially with the via openings. Following the formation of the structure of via and trench openings but before filling of the opening with certain types of conductive materials, a layer of liner, which may be a metal liner, may be deposited onto the bottom and/or to the sidewalls of the opening in the ILD layer. As is well-known in the art, the liner may be deposited to reduce and/or prevent possible diffusion of a conductive material, which fills up the via and trench opening in a follow-up step, into the ILD material for example during the manufacturing of the interconnect structure. Such diffusion of conductive metal materials into the ILD layer may cause device shortage and performance degradation, among others.

Conventionally, the metal liner may be deposited with a thickness that is sufficient to provide a relatively good coverage for the via openings. However, the metal liner in the trench region, which is deposited at the same time as that in the via region and thus having a thickness being dictated by the thickness of the metal liner deposited in the via region, may be unnecessarily thicker than it needs to be because a trench usually requires less liner coverage, as is known in the art. Consequently, a thicker metal liner in the trench region, coupled with a relatively low conductivity of the liner material, may cause an overall high resistance of the metal line formed later in the trench region.

In addition to possible high resistance, it is also well-known in the art that the conventional process of forming interconnect structures, as described above, may cause trenches or metal lines to have roughened trench bottoms. The roughness at the bottom of trench is known, as described below in detail, to be caused by performing via gouging before applying the metal liner to the via and trench openings. This roughness becomes particularly severe when a layer of ultra-low dielectric k-constant (ULK) material is used as the ILD layer. A roughened trench bottom may result in device performance degradation such as, for example, increased resistance and possible shortage with neighboring active devices, and in severe cases may force the trench to be formed with less depth.

Therefore, there exists a need in the art to tailor the thickness of the liner used in the trench region and in the via region during the formation of the interconnect structure and so to achieve better device performance. There is also a need for the mitigation of roughness at the bottom of trenches caused by the above conventional process during formation of the interconnect structure.

BRIEF DESCRIPTION OF THE DRAWINGS

The present invention will be understood and appreciated more fully from the following detailed description of the invention, taken in conjunction with the accompanying drawings of which.

It will be appreciated that for simplicity and clarity of illustration, elements shown in the drawings have not necessarily been drawn to scale. For example, the dimensions of some of the elements may be exaggerated relative to other elements for purpose of clarity.

SUMMARY OF THE INVENTION

Embodiments of the present invention provide a method of forming an interconnect structure in a layer of inter-layer dielectric (ILD) material. One embodiment of the method teaches creating one or more via openings in the layer of ILD material; forming a first liner covering at least one of the one or more via openings; creating one or more trench openings on top of at least one of the one or more via openings covered by the first liner; and forming a second liner covering at least one of the one or more trenching openings and at least part of the first liner. The method further teaches filling the via openings and trench openings with a conductive material; and planarizing the conductive material to be coplanar with a top surface of the layer of ILD material to form the interconnect structure, wherein the via openings are covered by the first and second liners and the trench openings are covered by the second liner.

According to one embodiment, the method teaches a step of, before forming the first liner, gouging the via openings to create a gouge at a bottom of the via openings in a conductive area of a prior level interconnect structure, wherein the gouging comprises ion-sputtering the bottom of the via openings to create the gouge suitable for the deposition of the first liner.

According to another embodiment, forming the first and/or second liner includes depositing a layer of metal lining material onto the via openings. The metal lining material may be selected from the group of Ta, TaN, Ti, TiN, W, WN and Ru. The layer of metal lining material has a thickness ranging from 1 metallic monolayer to tens of monolayers, and preferably between 1 and 5 monolayers.

According to yet another embodiment, creating the one or more via openings includes forming a photo-mask pattern representing a top view of the via openings and applying wet-etching to copy the pattern into the ILD material to produce the via openings. Similarly, creating the one or more trench openings includes forming a photo-mask pattern representing a top view of the trench openings and applying wet-etching to copy the pattern partially into the ILD material overlapping the via openings to produce the trench openings.

Embodiments of the present invention also provide an interconnect structure in a semiconductor chip for connecting one or more semiconductor devices. The interconnect structure includes one or more vias; one or more trenches formed on top of at least one of the one or more vias; a first liner lining perimeters of at least one of the one or more vias; and a second liner lining perimeters of the one or more trenches and the first liner. According to one embodiment, the first and/or second liners include Ta, TaN, Ti, TiN, W, WN and Ru materials.

Embodiments of the present invention further provide an interconnect structure, with tailored liner thicknesses at trench and via, serves to enhance the structural integrity of the via for reliability and reduce the parasitic electrical degradation through a more improved liner coverage, whilst optimizing conductivity performance of the trench.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure the embodiments of the invention.

A conventional BEOL processing may include following well-known operations or steps such as, for example, dielectric barrier ("cap") deposition, ILD deposition, hard-mask or photo-mask deposition, lithography, wet etching or dry etching, and deposition, among others. However, for the interest of not obscuring the presentation of essences of the present invention, processing steps that are well known in the art may be combined together for presentation and/or for illustration, and in some instances may not be described in detail. A person skilled in the art will appreciate that the following descriptions have rather focused on the distinctive features and/or elements of the present invention.

Figure 1:
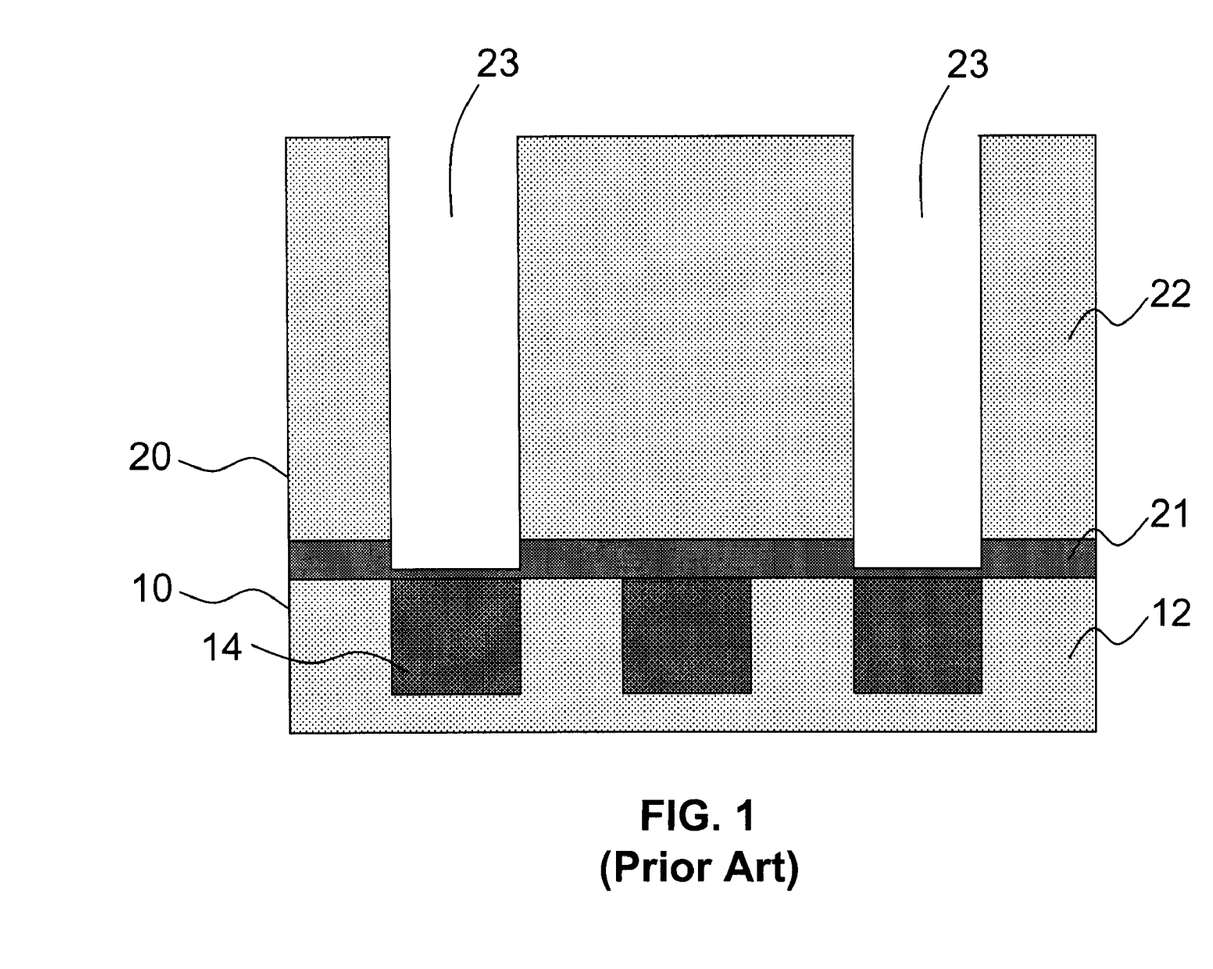
FIGS. 1-5 are illustrations of a conventional process and/or method of forming an interconnect unit and/or an interconnect structure.

FIGS. 1-5 are schematic illustrations of a conventional process and/or method of forming an interconnect unit and/or an interconnect structure. For example, FIG. 1 illustrates that an interconnect structure 20 may be formed on top of a prior level of interconnect structure 10. As is shown in FIG. 1, a dielectric barrier layer 21 may be formed or deposited directly on top of interconnect structure 10, upon which a layer of inter-level dielectric (ILD) material 22 may be subsequently formed. Next, one or more via openings 23 may be created or formed, through an etching process for example, in ILD layer 22. Via openings 23 may or may not be etched down into dielectric barrier layer 21. When via openings 23 are etched into dielectric barrier layer 21, they may not be etched through dielectric barrier layer 21 to cause exposure of trenches and/or vias 14 of prior interconnect structure 10. Interconnect structure 10, which may also be referred to as an interconnect layer or metal layer 10, may include one or more metal trenches and/or vias 14 embedded in a prior level of ILD layer 12.

Dielectric barrier layer 21 may be formed or deposited on top of prior interconnect layer 10 to enable adequate over-etch of ILD layer 22 and provide process tolerance due to variations. According to one conventional process, dielectric barrier layer 21 provides protection for the metal structure, for example Cu structure of prior interconnect layer 10, from destructive device processing environments, such as resist removal, and possible surface diffusion by processing chemicals into the metal structure causing reliability issues of the structure. Therefore, dielectric barrier layer 21 may not be etched through and the etching process may need to be controlled adequately.

Figure 2:
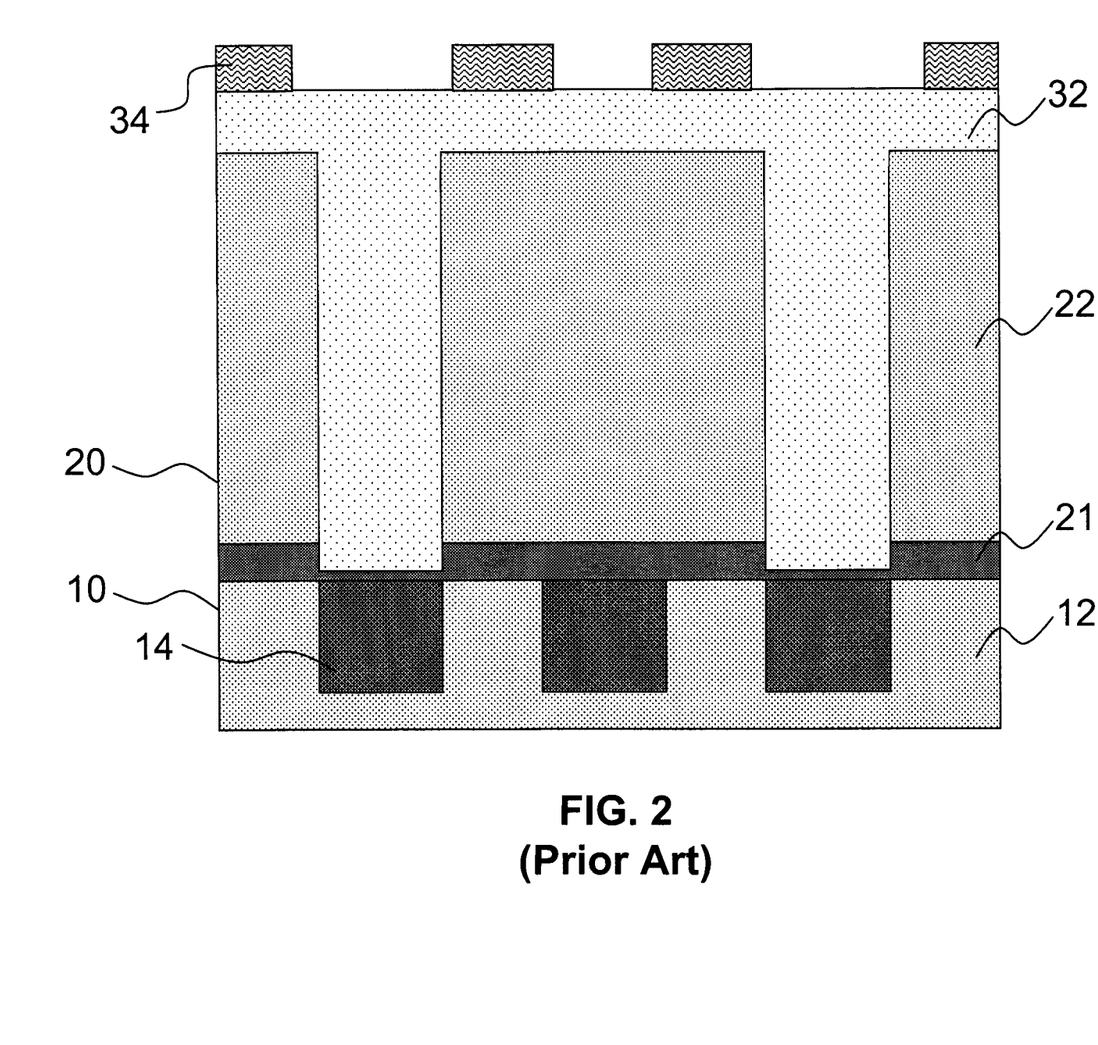

FIG. 2 illustrates that after the creation, via openings 23 may be filled with certain types of planarizing materials such as, for example, an anti-reflection coating (ARC) material 32. ARC material 32 may fill up via openings 23 and may cover the top surface of ILD layer 22. As is well known in the art, resist poisoning may occur at this stage as is common in advanced integration construction. Resist poisoning occurs due to unfavorable interaction between dielectric structures, such as via openings 23, and resist material, such as ARC material 32. Resist poisoning may interfere with proper development of features of resist material 32 and shall be avoid if possible.

Figure 3:
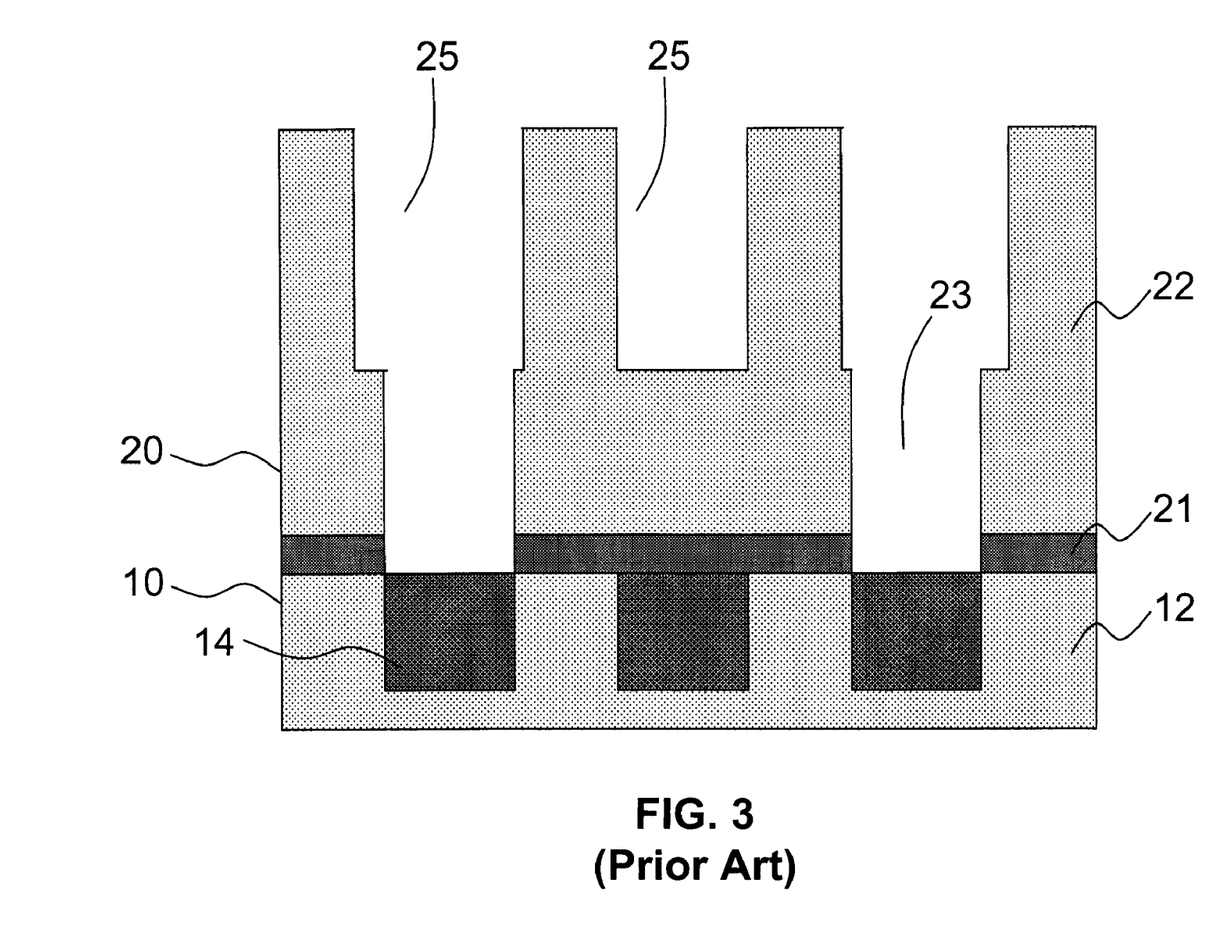

A top surface of ARC material 32 may be planarized either during application or using post-processing techniques. The planarization may include, but not limited to, spin-on program optimization, thermal reflow, or chemical mechanical polishing (CMP). On the planarized top surface of ARC material 32, a photo-mask 34 may subsequently be formed using techniques such as, for example, a lithographic technique or other conventional techniques that may be known in the art. Next to its formation, the pattern of photo-mask 34, representing a desired and/or pre-determined shape of trenches, may be copied down or transferred to ILD layer 22, as illustrated in FIG. 3, by using techniques such as, for example, a reactive ion etching (RIE) technique. The etching of trench pattern may stop at a pre-determined depth, which is less deep than that of via openings 23, thus to form one or more trench openings 25 on top of via openings 23. Following the formation of trench openings 25, ARC material 32 remaining in via openings 23 may be removed or stripped off, using well-known wet-etching or other techniques, to expose dielectric barrier layer 21 at the bottom of via openings 23 (FIG. 1). Dielectric barrier layer 21 at the bottom of via openings 23 is then removed by one of conventional etching processes, to expose metal element of trenches and/or vias 14 in the prior level of interconnect structure 10.

Figure 4:
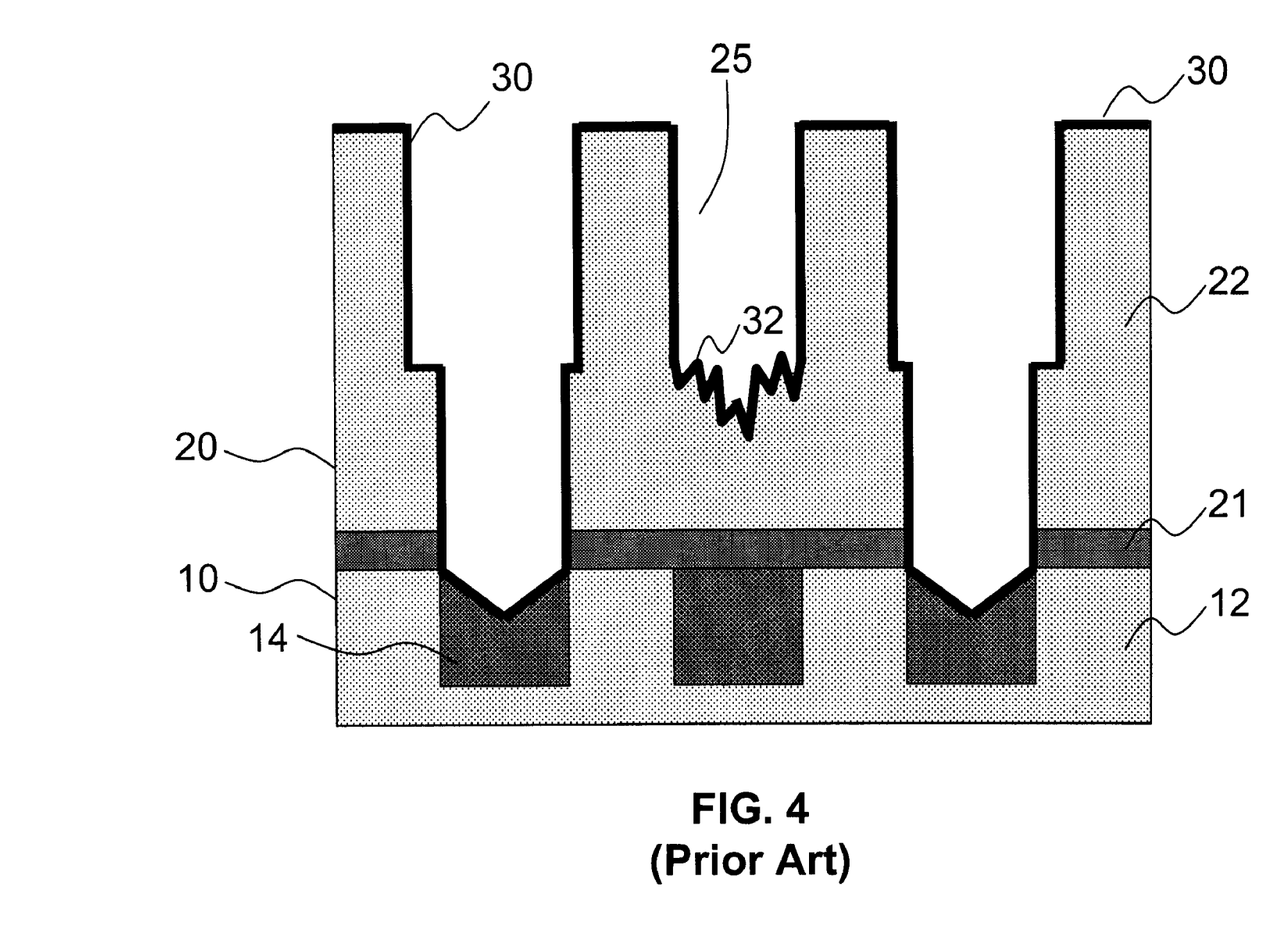

Conventionally, before depositing a liner 30 onto the exposed surface of trench openings 25 and via openings 23 as illustrated in FIG. 4, via gouging, such as ion sputtering, may be performed to mitigate stresses at the bottom of via openings 23 in order to improve adhesiveness of liner 30 to the metal element of trenches and/or vias 14 in prior interconnect layer 10. However, while it may improve the adhesiveness of liner 30 to the metal element, via gouging may roughen the bottom of trench 25 causing roughness 32. Roughness 32 becomes particularly severe when a porous ultra-low k-constant (ULK) material is used as ILD layer 22. As is well known in the art, porous ULK ILD is often used to reduce parasitic capacitance of interconnect structures and to enhance device performance which is often measured by the operational speed of the device.

Figure 5:
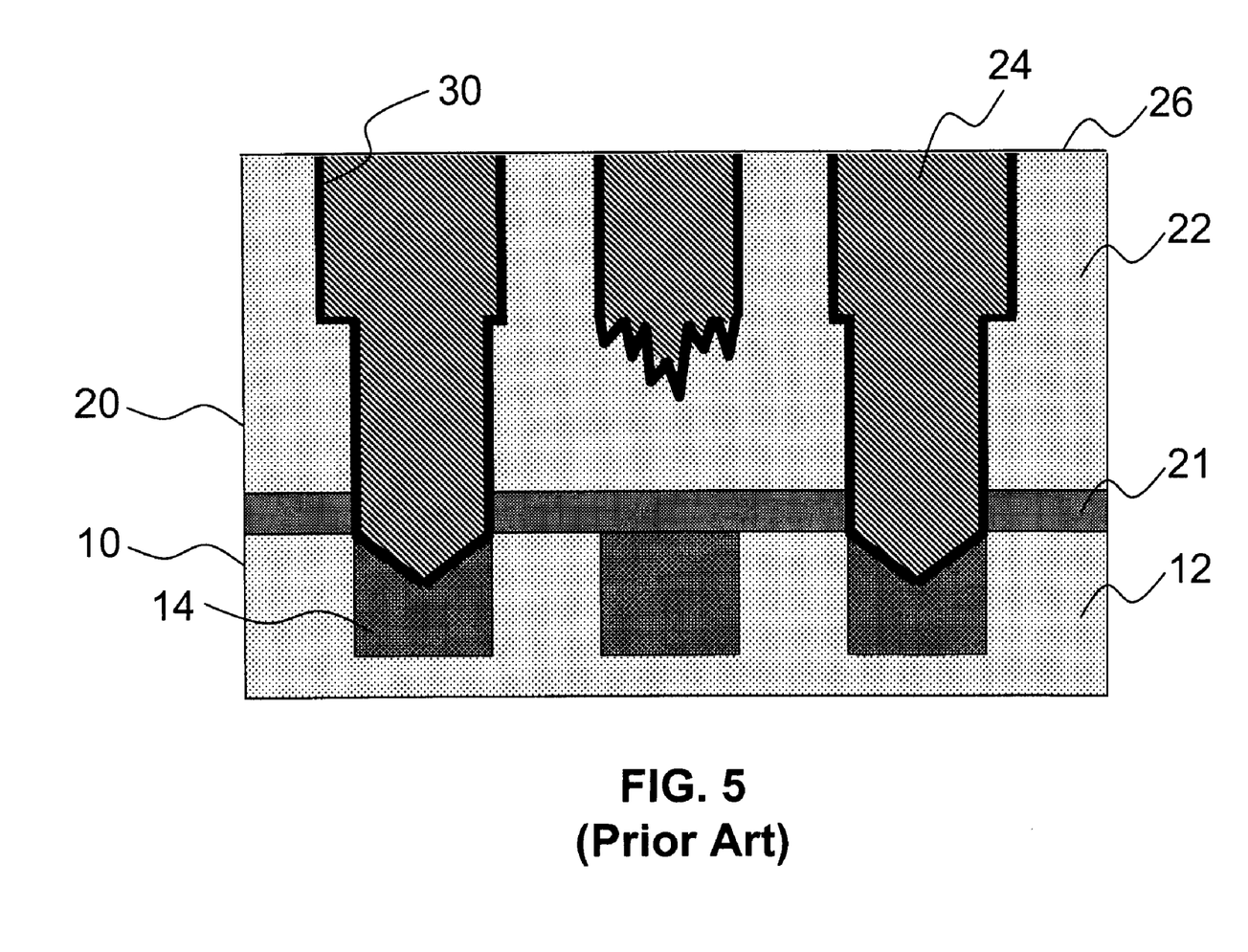

FIG. 5 illustrates that after the formation of liner 30, a conductive metal material 24 is filled in the via and trench openings according to the conventional process. Conductive metal material 24 may be separated or isolated from ILD layer 22 of, for example, porous ULK material by liner 30. Following the deposition or fill-up of conductive metal material 24 in via and trench openings 23 and 25, a planarizing process such as a CMP process, for example, may follow to produce a flat top surface 26 of interconnect layer or interconnect structure 20.

According to the above conventional process, since the liner 30 is designed to have a sufficient thickness in order to provide good coverage for the via openings 23. The thickness of liner 30 in the trench openings, deposited during the same process and therefore being dictated by the thickness in the via openings 23, may in general not be suitable or tailored for the trench openings 25. For example liner 30 at the sidewalls of trench openings 25 may be thicker than required and therefore may result in increase in overall resistance of the trench which includes conductive metal material 24 and liner 30. Liner 30 may be a metal liner.

As is also shown in FIG. 5, the roughness 32 at trench bottom 25 may cause device performance degradation such as, for example, increased resistance and possible shortage with neighboring active devices. In severe cases, this may cause limitation in the possible depth of trenches that may be formed.

According to one embodiment of the invention, a method or process is provided to create an interconnect layer or structure having dual liners of different thickness respectively for the trenches and for the vias. According to another embodiment of the invention, a method or process is provided to create an interconnect structure having via gouging at the bottom of vias but not at the bottom of trenches.

Figure 6:
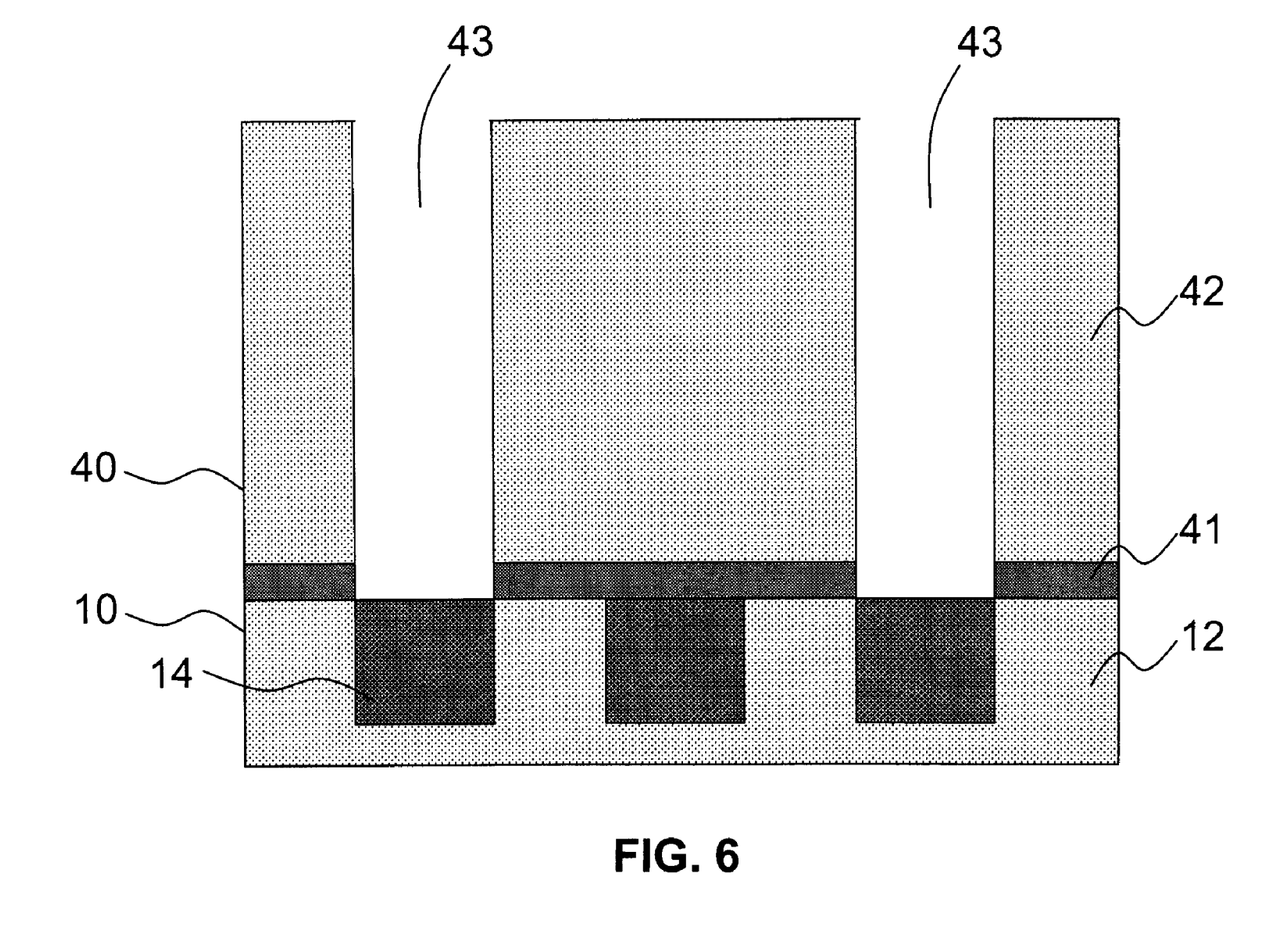
FIGS. 6-11 are illustrations of a dual liner interconnect structure and/or interconnect unit and a process of making the same according to one embodiment of the invention.

FIGS. 6-11 are illustrations of a dual liner interconnect structure and/or interconnect unit and a process of making the same according to one embodiment of the invention. In FIG. 6, dielectric barrier layer 41 may be formed or deposited on top of a prior level interconnect layer 10. Dielectric barrier layer 41 may include materials such as, for example, SiN, SiNCH or other suitable Si- and/or N-containing materials. FIG. 6 further illustrates the formation of an interconnect structure 40 on top of prior level interconnect layer 10 via dielectric barrier layer 41 by depositing an inter-level dielectric (ILD) layer 42 on top of dielectric barrier layer 41. One or more via openings 43 may be subsequently created or formed through for example etching in ILD layer 42. Via openings 43 may be etched down into, and through, dielectric barrier layer 41. According to one embodiment of the invention, dielectric barrier layer 41 may be removed at this stage (in contrary to a conventional process as shown in FIG. 2) without causing reliability and/or damage to the metallic structure 14 of prior level interconnect layer or metal layer 10, as described below in detail with reference to FIG. 7. Prior level of metal layer 10 may include one or more trenches and/or vias 14, made of a metal or metal element such as copper (Cu) or other suitable conductive materials. Trenches and/or vias 14 are embedded in ILD layer 12.

Figure 7:
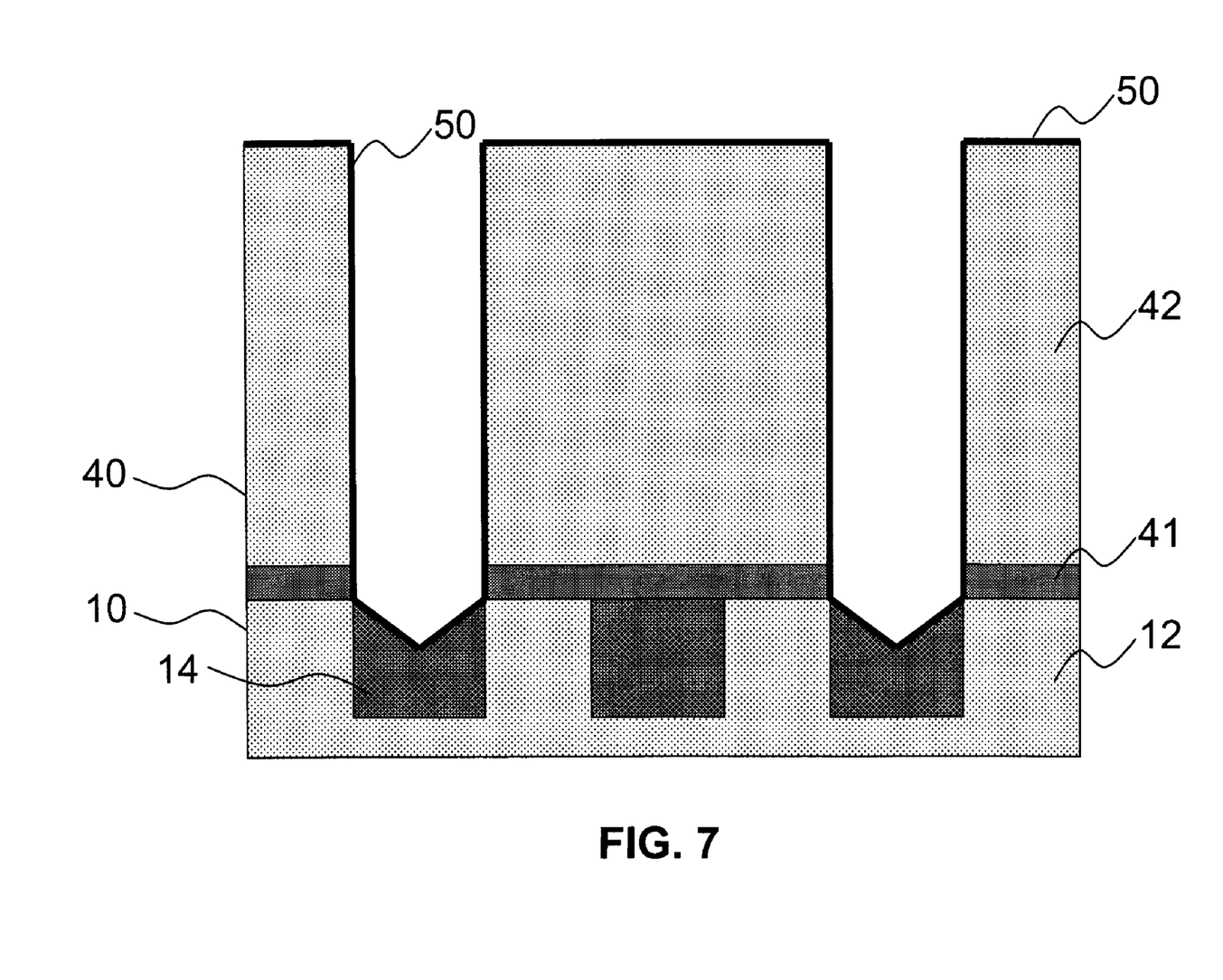

FIG. 7 illustrates that after their creation, a layer of lining material or a liner 50 may be deposited onto via openings 43 at the bottom and sidewalls, and on the top of interconnect structure 40. Liner 50 may be a metal liner and may include materials such as Ta, TaN, Ti, TiN, W, WN and Ru. The thickness of liner 50 may range from 1 metallic monolayer to tens of monolayers and preferably between 1 and 5 monolayers. However, the invention is not limited in this respect and other thicknesses may be used depending on factors such as, for example, the material of liner 50. Multiple layers of the afore-mentioned lining materials may be combined to form a multi-layer composite barrier structure for better performance. According to one embodiment of the invention, by protecting the metal (e.g., Cu) structure 14 of prior metal layer or interconnect layer 10 and covering dielectric via opening structure 43 of ILD layer 42, the application of metal liner 50 enables the removal of dielectric barrier layer 41 at this stage (FIG. 6) without causing possible reliability and/or damage to metal structure 14 and avoiding resist poisoning in a subsequent process step.

Before the deposition of metal liner 50, via gouging may be performed to mitigate stresses at the bottom of via openings 43 to improve adhesiveness of metal liner 50 to metal element 14 of prior level of interconnect layer 10. According to one embodiment of the invention, because the via gouging is performed prior to the creation of trench openings 55 (FIG. 9), roughness at the bottom of trenches caused by via gouging as those shown in FIG. 4 may be avoided. According to another embodiment of the invention, because metal liner 50 is deposited prior to the filling of via openings 43 with resist material 52 (FIG. 8), metal liner 50 prevents resist material 52 from getting direct contact with dielectric materials (41 and 42) and metal element 14, thus prevents potential negative and/or unfavorable interaction of dielectric materials (41 and 42) and metal element 14 with the resist materials, as that in a conventional process shown in FIG. 2.

Figure 8:
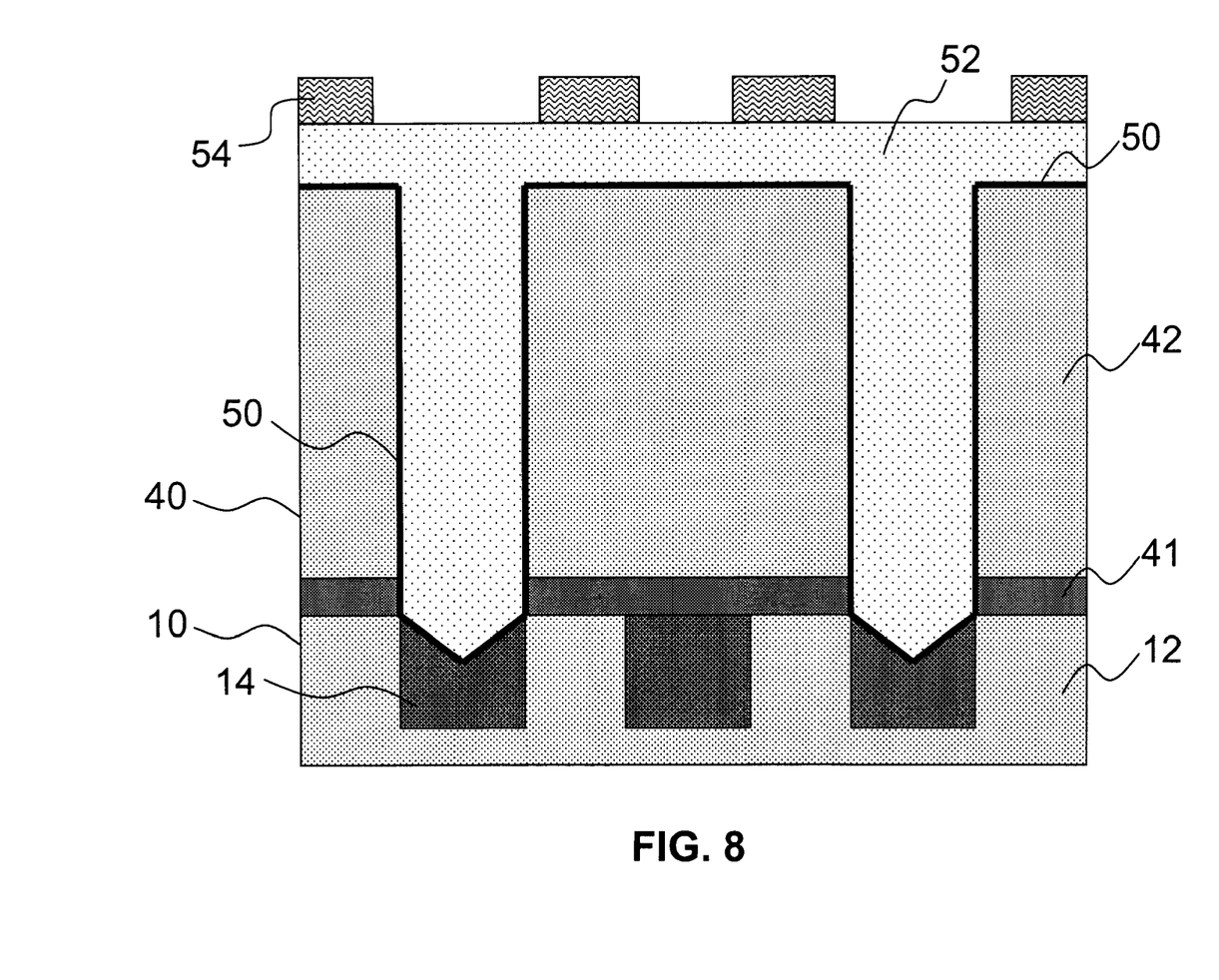

FIG. 8 illustrates that, after being covered by liner 50, via openings 43 may be subsequently filled with a material 52 suitable for planarization. Material 52 may include, but not limited to, OPL (organic planarizing layer), IPL (inorganic planarizing layer), ARC (anti-reflection coating) or combinations thereof. A top surface of material 52 may then be planarized, and on the planarized top surface of material 52, a photo-mask 54 may be developed using a conventional lithographic technique as may be known in the art.

Figure 9:
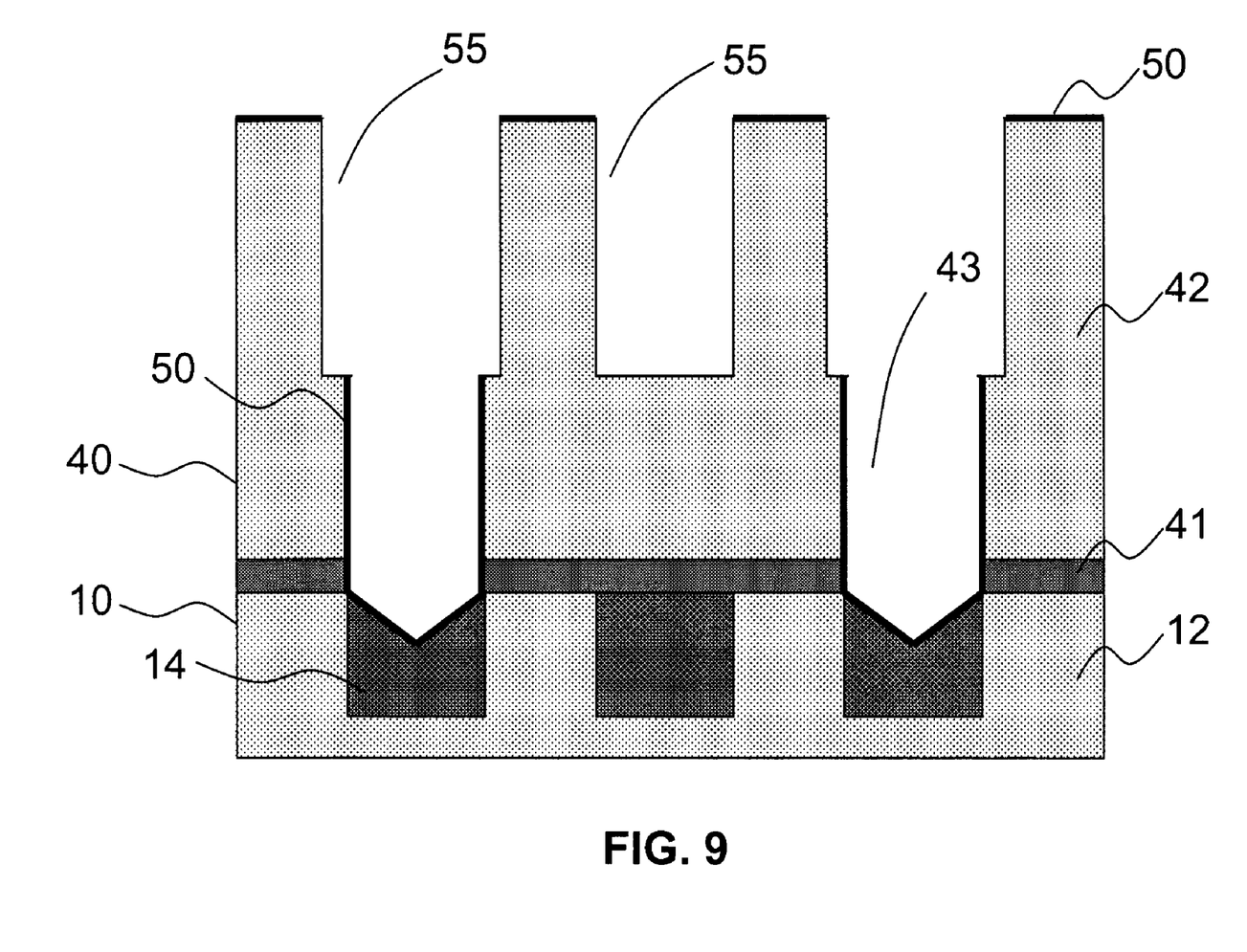

Following forming photo-mask 54 representing a desirable and/or pre-determined pattern of trenches to be formed, the trench pattern may be copied down into ILD layer 42, as illustrated in FIG. 9, through a process known as line-level etching and using one or more conventional methods such as, for example, a reactive ion etching (RIE) method. A combination of multiple techniques may be used such as a concerted etching process, which may be non-selective, to open the ARC, metallic liner and ILD materials. Or selective processes which would first open the ARC and followed by a metal etch chemistry to remove the metallic liner in the lithographically defined pattern area may be used. The etching may be fluorine rich to prevent possible metal residues. Then a separate dielectric etch process, which may stops at a pre-determined or desired depth less deep than that of via openings 43, may be employed to form one or more trench openings 55 on top of via openings 43.

According to one embodiment of the invention, a combination of selective and non-selective etch processes may be applied to control the extent of recess of ARC material 52 in the via region to ensure metallic liner 50 at the bottom of the via is preserved. Trench openings 55 may be created or formed on top of at least one via opening 43, have a width that may be approximately the same as the diameter of underneath via opening 43, and align vertically, at least on one side, with via opening 43. However, a person skilled in the art will appreciate that the invention may not be limited in this respect and trench openings 55 may have different widths from via openings 43, and in addition may not be in vertical alignment with via openings 43 as shown in FIG. 9. Furthermore, via openings 43 may have shapes other than those resembling a cylinder. Following the formation of trench openints, photo-mask 54 remaining at the top surface of ILD layer 42 and ARC material 52 remaining in via openings 43 may be removed by applying techniques, as may be well-known in the art, for example, a wet-etching technique.

Figure 10:
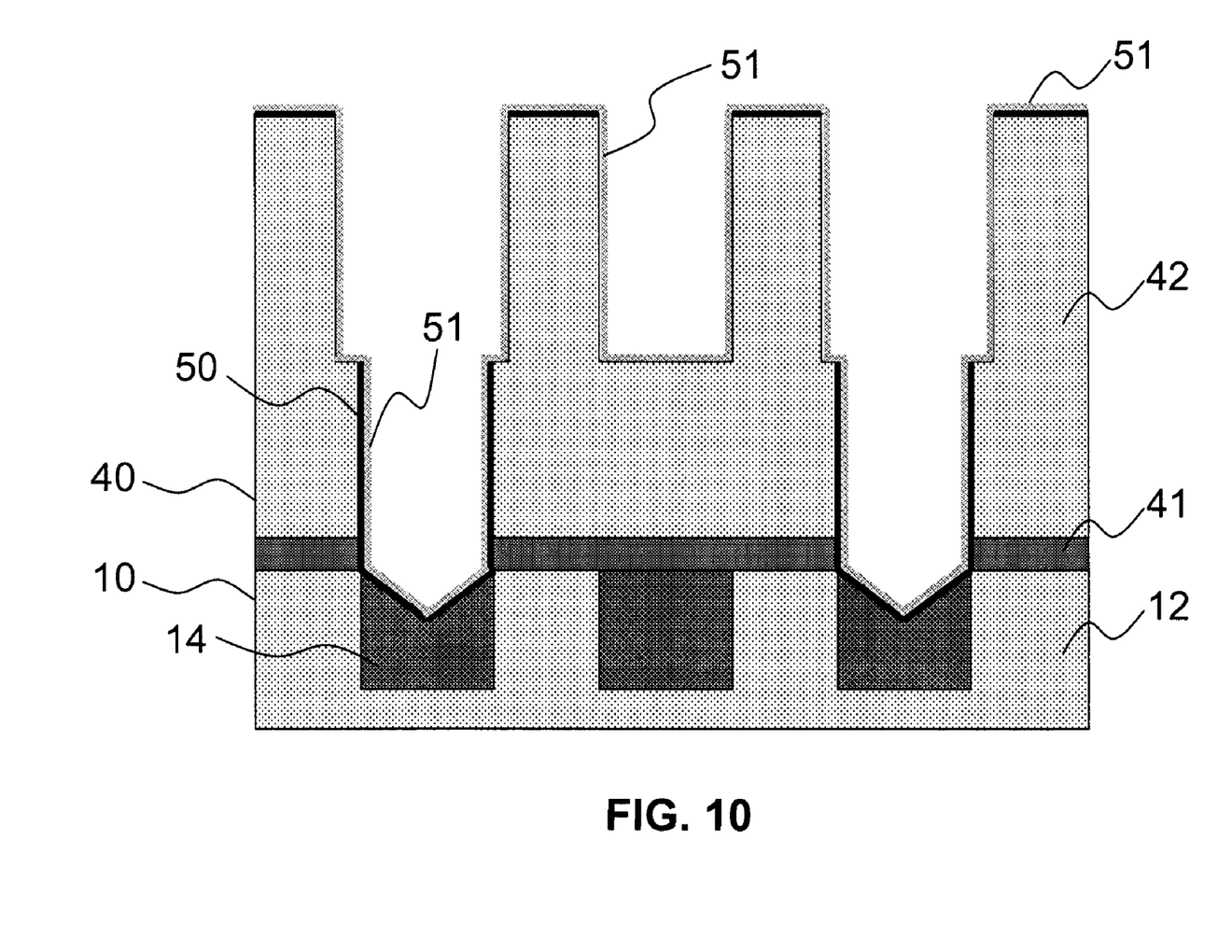

Next, a second layer of liner 51 may be applied or deposited onto the exposed sidewalls of trench openings 55 and on top of first layer of liner 50 inside via openings 43 as shown in FIG. 10. Liner 51 may be a metal liner and may include materials such as Ta, TaN, Ti, TiN, W, WN and Ru. Because this deposition of liner 51 is mainly applied for covering trench openings 55 and therefore not being restricted by the thickness of liner 50 covering via openings 43, thickness of liner 51 may be independently adjusted. For example, thickness of liner 51 may be optimized to achieve a relative low, and possibly, minimum resistance. Typically, the thickness of liner 51 may range from 1 metallic monolayer to tens of monolayers, and preferably between 1 and 5 monolayers but the invention is not limited in this respect and other thickness may be used depend on factors including, but not limited to, the material of liner 51. Multiple layers of the afore-mentioned liner materials may be combined to form a multi-layer composite barrier structure for optimal performance.

Figure 11:
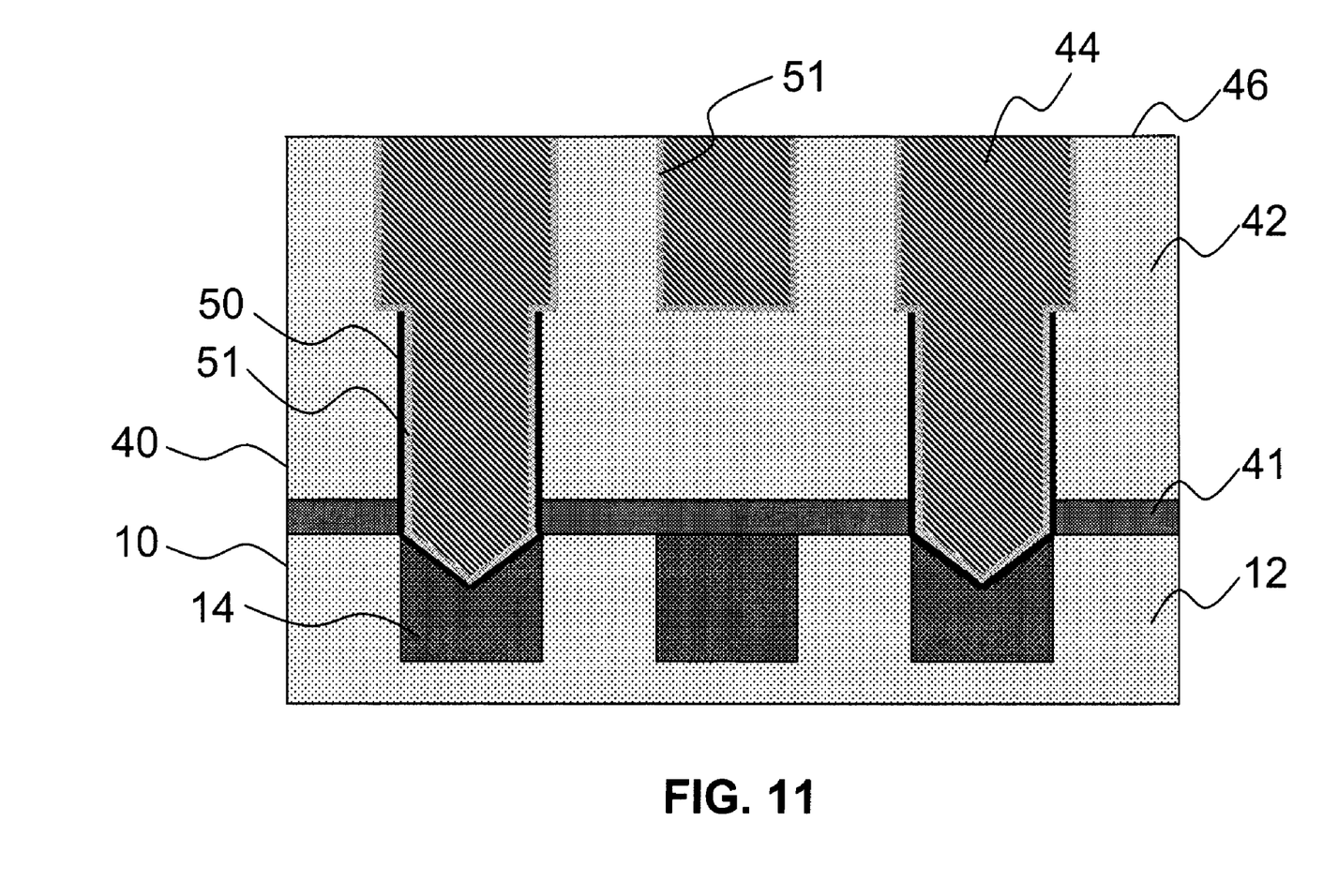

Following the deposition of second layer of liner 51, via and trench openings 43 and 55 may be filled with a metal material, such as copper (Cu), gold (Au), silver (Ag), tungsten (W) and alloys and/or compounds, as shown in FIG. 11, thereof suitable for interconnecting active devices. The filling of openings 43 and 55 may be through plating or seeding, forming interconnect metal line 44. A top surface of the metal material filling via and trench openings 43 and 55 may be planarized to be coplanar with the top surface of interconnect structure 40 through, for example, a CMP process. The resulting flat surface 46 may be suitable for subsequent device processing such as the manufacturing of a next level interconnect layer.

An additional advantage provided by this invention is that the multiple metallic liner depositions may be tailored to provide a thicker liner in the field. A thicker liner provides a wider process window during Cu CMP as described above. For example, during a two step Cu CMP polish, the process may be designed to stop on the field liner or liner 50 (FIG. 10). The thicker field liner 50 enables more aggressive Cu polishing without compromising integrity of the dielectric material below. Otherwise, a lack of selectivity between the Cu polish step and the liner may contribute to the cause of non-planarity. The thicker liner provided by this invention can lead to improved planarity.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming an interconnect structure in a layer of inter-layer dielectric (ILD) material, the method comprising:
    creating one or more via openings in said layer of ILD material;
    forming a first liner covering at least one of said one or more via openings;
    creating one or more trench openings on top of at least one of said one or more via openings whose bottom and sidewalls are covered by said first liner, wherein at least one of said one or more trench openings being away from, and not on top of, said one or more via openings; and
    forming a second liner covering said one or more trench openings and at least part of said first liner.

2. The method of claim 1, further comprising:
    filling said via openings and trench openings with a conductive material; and
    planarizing said conductive material to be coplanar with a top surface of said layer of ILD material to form said interconnect structure,
    wherein said via openings are covered by said first and second liners and said trench openings are covered by said second liner.

3. The method of claim 1, wherein said conductive material is selected from the group of copper (Cu), gold (Au), silver (Ag), tungsten (W), or a combination thereof.

4. The method of claim 1, further comprising, before forming said first liner, gouging said via openings to create a gouge at a bottom of said via openings in a conductive area of a prior level interconnect structure.

5. The method of claim 1, wherein said gouging comprises ion-sputtering said bottom of said via openings to create said gouge suitable for the deposition of said first liner.

6. The method of claim 1, wherein forming said first liner comprises depositing a layer of metal lining material onto said via openings, said metal lining material being selected from the group of Ta, TaN, Ti, TiN, W, WN and Ru.

7. The method of claim 6, wherein said layer of metal lining material has a thickness ranging from 1 metallic monolayer to tens of monolayers, and preferably between 1 and 5 monolayers.

8. The method of claim 1, wherein forming said second liner comprises depositing a layer of metal lining material onto said via openings and said trench openings, said metal lining material being selected from the group of Ta, TaN, Ti, TiN, W, WN and Ru.

9. The method of claim 8, wherein said layer of metal lining material has a thickness ranging from 1 metallic monolayer to tens of monolayers, and preferably between 1 and 5 monolayers.

10. The method of claim 1, wherein creating said one or more via openings comprises forming a photo-mask pattern representing a top view of said via openings and applying wet-etching to copy said pattern into said ILD material to produce said via openings.

11. The method of claim 1, wherein creating said one or more trench openings comprises forming a photo-mask pattern representing a top view of said trench openings and applying wet-etching to copy said pattern partially into said ILD material overlapping said via openings to produce said trench openings.

12. A method of forming a multi-layer interconnect unit including at least a first and a second layer of interconnect structure, the method comprising:
    forming a layer of inter-layer dielectric (ILD) material upon said first layer of interconnect structure;
    creating one or more via openings in said layer of ILD material;
    forming a first liner covering at least one of said one or more via openings;
    creating one or more trench openings on top of at least one of said one or more via openings whose bottom and sidewalls are covered by said first liner, wherein at least one of said one or more trench openings being away from, and not on top of, said one or more via openings; and
    forming a second liner covering said one or more trench openings and at least part of said first liner.

13. The method of claim 12, further comprising forming a dielectric barrier layer before forming said layer of ILD material.

14. The method of claim 12, further comprising:
    plating a metal material in said via openings and trench openings created in said layer of ILD material; and planarizing said metal material to be coplanar with a top surface of said ILD material to form said second layer of interconnect structure, wherein said via openings are covered by said first and second liners and said trench openings are covered by said second liner.

15. The method of claim 14, further comprising gouging said via openings to expose a metal interconnect element of said first interconnect layer of said interconnect before forming said first liner.

16. The method of claim 15, wherein said gouging comprises ion-sputtering a bottom of said via openings to prepare a gouge for the deposition of said first liner.

17. The method of claim 12, wherein forming said first liner comprises depositing a layer of metal lining material onto said via openings, said metal lining material being selected from the group of Ta, TaN, Ti, TiN, W, WN and Ru.

18. The method of claim 17, wherein said layer of metal lining material has a thickness ranging from 1 metallic monolayer to tens of monolayers, and preferably between 1 and 5 monolayers.

19. A method of forming an interconnect unit, the method comprising:

forming a dielectric barrier layer direct upon a first interconnect layer;

forming a layer of inter-layer dielectric (ILD) material on said dielectric barrier layer;

creating one or more via openings in said layer of ILD material;

forming a first metallic liner covering at least one of said one or more via openings;

creating one or more trench openings on top of at least one of said one or more via openings whose bottom and sidewalls are covered by said first metallic liner, wherein at least one of said one or more trench openings being away from, and not on top of, said one or more via openings; and forming a second metallic liner covering said one or more trench openings and at least part of said first metallic liner.

20. The method of claim 19, further comprising:

plating a metal material in said via openings and trench openings created in said layer of ILD material; and planarizing a top surface of said ILD material plated with said metal material to form said second interconnect layer, wherein said via openings are covered by said first and second liners and said trench openings are covered by said second liner.

21. The method of claim 20, wherein said planarizing said top surface of said ILD material comprises applying a chemical-mechanical-polish (CMP) process to made flat of said top surface.

22. The method of claim 19, further comprising gouging said via openings to expose a metal interconnect element of said first interconnect layer of said interconnect before forming said first liner.

23. The method of claim 22, wherein said gouging comprises ion-sputtering a bottom of said via openings to prepare a gouge for the deposition of said first liner.

24. The method of claim 19, wherein forming said first liner comprises depositing a layer of metal lining material onto said via openings, said metal lining material being selected from the group of Ta, TaN, Ti, TiN, W, WN and Ru.

25. The method of claim 24, wherein said layer of metal lining material has a thickness ranging from 1 metallic monolayer to tens of monolayers, and preferably between 1 and 5 monolayers.

26. An interconnect structure in a semiconductor chip for connecting one or more semiconductor devices, the interconnect structure comprising:

one or more vias formed in a layer of inter-layer dielectric (ILD) material;

one or more trenches formed on top of at least one of said one or more vias, wherein at least one of said one or more trenches being away from, and not on top of, said one or more vias;

a first liner lining perimeters, including bottom and sidewalls, of at least one of said one or more vias; and a second liner lining perimeters of said one or more trenches and said first liner.

27. The interconnect structure of claim 26, further comprising a layer of dielectric barrier layer between said ILD material and a prior level interconnect structure.

28. The interconnect structure of claim 26, wherein said first liner comprises Ta, TaN, Ti, TiN, W, WN and Ru materials.

29. The interconnect structure of claim 26, wherein said second liner comprises Ta, TaN, Ti, TiN, W, WN and Ru material.

30. The interconnect structure of claim 26, wherein said one or more vias have gouges formed into a conductive area of an interconnect structure of a prior level.

* * * * *